(12) United States Patent
Lee et al.

(10) Patent No.: US 11,316,094 B2
(45) Date of Patent: Apr. 26, 2022

(54) PASTE COMPOSITION AND PREPARATION METHOD THEREFOR

(71) Applicant: KOREA RESEARCH INSTITUTE OF CHEMICAL TECHNOLOGY, Daejeon (KR)

(72) Inventors: Su Yeon Lee, Daejeon (KR); Young Min Choi, Daejeon (KR); Sun Ho Jeong, Daejeon (KR); Beyong Hwan Ryu, Daejeon (KR); Eun Jung Lee, Daejeon (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 0 days.

(21) Appl. No.: 16/237,252

(22) Filed: Dec. 31, 2018

(65) Prior Publication Data

US 2019/0181331 A1 Jun. 13, 2019

Related U.S. Application Data

(63) Continuation-in-part of application No. PCT/KR2017/007026, filed on Jul. 3, 2017.

(30) Foreign Application Priority Data

Jul. 1, 2016 (KR) .......................... 10-2016-0083502

(51) Int. Cl.
| | |
|---|---|
| *H01L 41/187* | (2006.01) |
| *H01L 41/37* | (2013.01) |
| *H01L 41/193* | (2006.01) |
| *H01L 41/18* | (2006.01) |

(52) U.S. Cl.
CPC ............ *H01L 41/187* (2013.01); *H01L 41/18* (2013.01); *H01L 41/193* (2013.01); *H01L 41/37* (2013.01)

(58) Field of Classification Search
None
See application file for complete search history.

(56) References Cited

U.S. PATENT DOCUMENTS

| 2013/0049530 A1* | 2/2013 | Koo ..................... H01L 41/45 |
| | | 310/300 |
| 2018/0151278 A1* | 5/2018 | Ferrie ..................... H01F 1/12 |

FOREIGN PATENT DOCUMENTS

| KR | 20060111283 A | 10/2006 |
| KR | 20110119278 A | 11/2011 |
| KR | 20130139603 A | 12/2013 |
| KR | 20140105136 A | 9/2014 |
| KR | 20150091400 A | 8/2015 |

OTHER PUBLICATIONS

Machine Translation of Su et al. KR20060111283 (Year: 2006).*
Technical Report: Guidance To Operation of Water Quality Laboratories (Year: 2002).*
Chakraborti, S. et al., "Interaction of Polyethyleneimine-Functionalized ZnO Nanoparticles with Bovine Serum Albumin," Langmuir, vol. 28, No. 30, Jul. 2, 2012, 11 pages.
ISA Korean Intellectual Property Office, International Search Report Issued in Application No. PCT/KR2017/007026, dated Oct. 10, 2017, WIPO, 4 pages.

* cited by examiner

*Primary Examiner* — Robert T Butcher
(74) *Attorney, Agent, or Firm* — McCoy Russell LLP

(57) ABSTRACT

The present invention relates to: a paste composition including ceramic particles surface-functionalized with an amine group and a maleic anhydride-grafted elastomer; and a preparation method therefor and, to: a paste composition enabling ceramic particles to have a high content and be highly dispersed, thereby enabling the composition to have a high generation capacity when a device is manufactured; and a preparation method therefor.

18 Claims, 3 Drawing Sheets

PASTE COMPOSITION AND PREPARATION METHOD THEREFOR

CROSS REFERENCE TO RELATED APPLICATION

The present application is a Continuation-in-Part of International Patent Application No. PCT/KR2017/007026, entitled "ENERGY HARVESTING PASTE COMPOSITION AND PREPARATION METHOD THEREFOR," filed on Jul. 3, 2017. International Patent Application No. PCT/KR2017/007026 claims priority to Korean Patent Application No. 10-2016-0083502 filed on Jul. 1, 2016. The entire contents of each of the above-identified applications are hereby incorporated by reference in their entirety for all purposes.

TECHNICAL FIELD

The following disclosure relates to a paste composition, and a preparation method therefor, and more particularly, to a paste composition enabling ceramic particles to have a high content and be highly dispersed, thereby achieving the composition to have a high power generation capacity when a device is manufactured, and a preparation method therefor.

BACKGROUND

In recent years, energy harvesting technologies, which collect energy such as power, pressure, and vibration that are abandoned or consumed in everyday life and convert the collected energy into electrical energy, are attracting attention as new and renewable energy generation technology.

In particular, piezoelectric power generation employing a piezoelectric material among the energy harvesting technologies is particularly attracting attention due to advantages that unlike other existing eco-friendly new and renewable energy, there is no limitation of climate and topography change, an energy conversion efficiency is high, and miniaturization and weight reduction are achieved to provide application possibilities in various areas.

Piezoelectric power generation, which uses piezoelectric effects, is a technology capable of converting mechanical energy such as external pressure and vibration into electric energy using a piezoelectric material, storing the electric energy in an energy storage device, and employing the energy.

Materials that are currently applied as piezoelectric materials may be divided into single crystal materials such as $\alpha$-AlPO$_4$ (Berlnite), $\alpha$-SiO$_2$ (Quartz), LiTaO$_3$, LiNbO$_3$, SrxBayNb$_2$O$_8$, Pb$_5$—Ge$_3$O$_{11}$, Tb$_2$(MoO$_4$)$_3$, Li$_2$B$_4$O$_7$, CdS, ZnO, Bi$_{12}$SiO$_{20}$, and Bi$_{12}$GeO$_{20}$, and the like, polycrystalline ceramics such as lead zirconate titanate (PZT)-based, lead titanate (PT)-based, PZT-complex perovskite-based, and BaTiO$_3$, and the like, polymer materials such as polyvinylidene difluoride (PVDF), poly(vinylidene fluoride-co-trifluoroethylene) [P(VDF-TrFE)], and poly(vinylidene fluoride-co-tetrafluoroethylene) [P(VDF-TeFE)], and the like, ZnO, CdS, AlN, or thin film materials with polycrystalline composition, and composite materials in which polycrystalline ceramics are composed with a polymer such as PZT-PVDF, PZT-silicone rubber, PZT-epoxy resin, and PZT-foamed urethane, and the like.

Among them, in a case where the composite material in which the polycrystalline ceramics are composed with a polymer is applied as an energy generating material, the existing energy harvesting device has problems in that the polycrystalline ceramics and the polymer are simply mixed to produce the composite material, and thus it is difficult to mix the polycrystalline ceramics over a predetermined amount, thereby having a limitation in improving power generation capacity, and in that the material is non-uniformly produced due to low dispersibility (Korean Patent Laid-Open Publication No. 10-2013-0139603).

Therefore, it is necessary to develop a paste composition enabling ceramic particles to have a high content and be highly dispersed, thereby achieving the composition to have a high power generation capacity when an energy harvesting device is manufactured.

SUMMARY

An object of the present invention is to provide a paste composition enabling ceramic particles to have a high content and be highly dispersed, thereby achieving the composition to have a high power generation capacity when a device is manufactured, and a preparation method therefor.

In one general aspect, a paste composition includes ceramic particles surface-functionalized with an amine group, and a maleic anhydride-grafted elastomer.

In another general aspect, a thin film includes ceramic particles surface-functionalized with an amine group, and a maleic anhydride-grafted elastomer.

In still another general aspect, a device includes: a thin film including ceramic particles surface-functionalized with an amine group and a maleic anhydride-grafted elastomer.

In still another general aspect, a preparation method of a paste composition, the preparation method including: a) stirring a reaction solution including ceramic particles and a polyamine-based compound to produce ceramic particles surface-functionalized with an amine group; and b) preparing a paste composition including the ceramic particles surface-functionalized with an amine group, and a maleic anhydride-grafted elastomer.

In still another general aspect, there is provided an energy harvesting method in which power energy, pressure energy or vibration energy is converted into electrical energy through a device including a thin film produced by applying and drying a paste composition into a mold, the paste composition including ceramic particles surface-functionalized with an amine group, and a maleic anhydride-grafted elastomer.

DETAILED DESCRIPTION OF EMBODIMENTS

Figure 1:
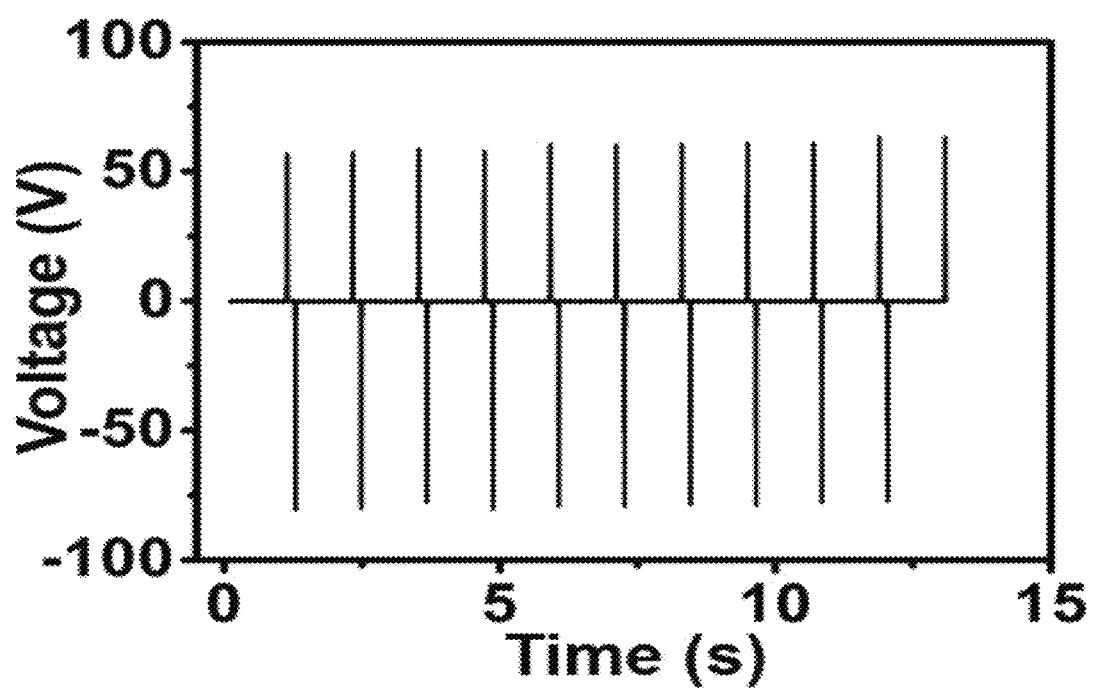
FIG. 1 is a power generation voltage of an energy harvesting device manufactured by using an energy harvesting paste composition of Example 1.

Hereinafter, a paste composition of the present invention and a preparation method thereof are described in detail with reference to the accompanying drawings. The drawings to be provided below are provided by way of example so that the idea of the present invention can be sufficiently transferred to those skilled in the art to which the present invention pertains. Therefore, the present invention is not limited to the following drawings, but may be embodied in other forms, and the following drawings may be exaggerated in order to clarify the spirit of the present invention. In addition, like reference numerals denote like elements throughout the specification.

Technical terms and scientific terms used in the present specification have the general meaning understood by those skilled in the art to which the present invention pertains unless otherwise defined, and a description for the known function and configuration obscuring the present invention will be omitted in the following description and the accompanying drawings.

The conventional energy harvesting device has problems in that the polycrystalline ceramics and the polymer are simply mixed to produce the composite material, and thus it is difficult to mix the polycrystalline ceramics over a predetermined amount, thereby having a limitation in improving the power generation capacity, and in that the material is non-uniformly produced due to low dispersibility.

Accordingly, the present applicant conducted intensive research in order to produce the composite material enabling the ceramic particles to have a high content and be highly dispersed, and as a result, found that when the surface of the ceramic particles was functionalized with an amine group, dispersibility of the ceramic particles was remarkably improved.

In particular, the present applicant found that when the maleic anhydride-grafted elastomer was used as the polymer, it was possible for the ceramic particles to have high content together with high dispersibility, thus achieving high power generation capacity when an energy harvesting device is manufactured, and completed the present invention.

More specifically, the present invention provides a paste composition including ceramic particles surface-functionalized with an amine group, and a maleic anhydride-grafted elastomer. In detail, the present invention provides an energy harvesting paste composition, wherein the ceramic particles having a negative charge and a polyamine-based compound having a positive charge may be mixed to functionalize a surface of the ceramic particles with an amine group by electrostatic interaction.

As described above, the ceramic particles in the polymer may be uniformly dispersed by using the ceramic particles surface-functionalized with an amine group. In particular, by using the maleic anhydride-grafted elastomer as the polymer, compatibility between the elastomer and the ceramic particles may increase, and thus the content of the ceramic particles in the composition may significantly increase. Therefore, it is possible to manufacture a device in which the ceramic particles having a high content are uniformly dispersed, and the power generation capacity is capable of being improved.

In an example of the present invention, the ceramic particles surface-functionalized with an amine group may be ceramic particles surface-coated with a polyamine-based compound. In other words, the ceramic particles may have a polyamine-based compound coating layer. By having the polyamine-based compound coating layer described above, the surface of the ceramic particles may be easily functionalized with an amine group, and the ceramic particles may have improved dispersibility when the ceramic particles are mixed with the maleic anhydride-grafted elastomer.

Specifically, the polyamine-based compound may be a polyamine-based polymer, a polyamine-based monomer, or a mixture thereof, which contains two or more amine groups. By coating a surface of the ceramic particles with the polyamine-based compound containing two or more amine groups, the ceramic particles may be uniformly and densely functionalized with amine groups throughout the entire surface thereof, and may have further improved dispersibility when the ceramic particles are mixed with the maleic anhydride-grafted elastomer.

As specific examples, the polyamine-based polymer may be any one or two or more selected from the group consisting of polyalkyleneimine, polyvinylamine, polyamidoamine, polyallylamine, and polyetheramine, and the like. The polyamine-based monomer may be any one or two or more selected from the group consisting of alkylenediamine, dialkylenetriamine, trialkylenetetramine, p-phenylenediamine, m-phenylenediamine. 2,5-diaminotoluene, 2,6-diaminotoluene, 1,3-bis(4,4'-aminophenoxy)benzene, 4,4'-diamino-1,5-phenoxypentane, 4,4'-diaminobiphenyl, 3,3'-dimethyl-4,4'-diaminobiphenyl, 3,3'-dimethoxy-4,4'-diaminobiphenyl, 4,4'-diaminodiphenyl ether, 4,4'-diaminodiphenyl methane. 2,2'-diaminodiphenyl propane, bis(3,5-diethyl-4-aminophenyl)methane, diaminodiphenylsulfone, diaminobenzophenone, diaminonaphthalene, 1,4-bis(4-aminophenoxy)benzene, 1,4-bis(4-aminophenyl) benzene, 9,10-bis(4-aminophenyl)anthracene, 1,3-bis(4-aminophenoxy)benzene, 4,4'-bis(4-aminophenoxy)diphenyl sulfone, 2,2-bis[4-(4-aminophenoxy)phenyl]propane, 2,2'-trifluoromethyl-4,4'-diaminobiphenyl, 1,4-diaminocyclohexane, 1,2-diaminocyclohexane, 1,4-cyclohexane-bis (methylamine), and 4,4'-diaminodicyclohexylmethane, and the like, and as a more specific example, the polyamine-based compound may be preferably polyalkyleneimine such as polyethyleneimine or polypropyleneimine, or the like, containing an alkylene group having 2 to 5 carbon atoms.

Preferably, it may be effective to use the polyamine-based polymer in improving a thickness of the polyamine-based compound coating layer. By improving the thickness of the polyamine-based compound coating layer, it is possible to improve compatibility with the maleic anhydride-grafted elastomer, and thus the content of the ceramic particles in the composition may significantly increase. Therefore, it is possible to manufacture a device in which the ceramic particles having a high content are uniformly dispersed, and energy generation properties such as power generation capacity, and the like, are capable of being improved.

More preferably, it may be more effective to use a polyamine-based polymer having a number average molecular weight (Mn) of 10,000 to 80.000 g/mol, particularly preferably a polyamine-based polymer having a number average molecular weight (Mn) of 50.000 to 80.000 g/mol in improving the thickness of the polyamine-based compound coating layer.

Thus, the ceramic particles coated with the polyamine-based compound may have a coating layer having a thickness of 1 to 20 nm. Within the range as described above, the compatibility with the maleic anhydride-grafted elastomer may be remarkably improved.

Here, the ceramic particles are not specifically limited as long as they are ceramic particles for a piezoelectric material that are generally used in the art, and have an excellent piezoelectric effect. Specifically, for example, the ceramic particles may be any one or two or more selected from the group consisting of lead zirconate titanate (PZT), lead titanate, barium titanate, zinc oxide, aluminum nitride, cadmium sulfide, bismuth iron oxide, and silicon carbide, and the like. Preferably, the use of PZT may be more desirable in improving the power generation capacity.

In an example, the ceramic particles may have an average particle size of 100 to 1,000 nm. Within the range as described above, the dispersibility of the ceramic particles may be improved. If a size of the ceramic particles is excessively large, the dispersibility may be lowered, resulting in deterioration of energy generation properties.

In an example of the present invention, it may be preferable to use the maleic anhydride-grafted elastomer having excellent elasticity and being easily deformed by mechanical force such as pressure, tension, vibration, or the like. Specifically, for example, the elastomer may be any one or two or more selected from the group consisting of a polystyrene-based block copolymer-graft-maleic anhydride block copolymer, a polyolefin-based-graft-maleic anhydride elastomer, a polyamide-based-graft-maleic anhydride elastomer, and a polyester-based-graft-maleic anhydride elastomer, and the like.

Preferably, it may be more preferable to use the polystyrene-based block copolymer-graft-maleic anhydride block copolymer in uniformly dispersing ceramic particles surface-functionalized with an amine group and improving a mixed content of the ceramic particles to improve the power generation capacity. As a specific example, the polystyrene-based block copolymer-graft-maleic anhydride block copolymer may be a styrene-ethylene-butylene-styrene-graft-maleic anhydride (SEBSm)-based block copolymer (polystyrene-block-poly(ethylene-ran-butylene)-block-polystyrene-graft-maleic anhydride: SEBSm).

Even more preferably, a styrene-based block copolymer (SBC) may be further used together with the maleic anhydride-grafted elastomer. In other words, the paste composition according to an embodiment of the present invention may further include any one or two or more second elastomers selected from the group consisting of a styrene-butylene-styrene (SBS)-based block copolymer, a styrene-isoprene-styrene (SIS)-based block copolymer, a styrene-ethylene-butylene-styrene (SEBS)-based block copolymer, and a styrene-ethylene-propylene-styrene (SEPS)-based block copolymer, and the like.

As described above, by using a mixture of the second elastomer together with the maleic anhydride-grafted elastomer, energy generation properties may be remarkably improved.

Preferably, when the styrene-ethylene-butylene-styrene-graft-maleic anhydride (SEBSm)-based block copolymer is mixed with the styrene-ethylene-butylene-styrene (SEBS)-based block copolymer, the energy generation properties may be more remarkably improved.

In an example of the present invention, the maleic anhydride-grafted elastomer and the second elastomer may be mixed in a weight ratio of 3:7 to 7:3, and more preferably in a weight ratio of 4:6 to 6:4. Within the range as described above, a high dispersibility and a high content of the ceramic particles may not be inhibited.

The paste composition may be prepared by mixing the ceramic particles surface-functionalized with an amine group and the maleic anhydride-grafted elastomer described above. More specifically, the ceramic particles surface-functionalized with an amine group and the maleic anhydride-grafted elastomer may be mixed to prepare an energy harvesting paste composition. Here, the ceramic particles surface-functionalized with an amine group and the maleic anhydride-grafted elastomer may have a weight ratio of 1:0.01 to 10, and within the range as described above, a high power generation capacity may be secured. More preferably, the ceramic particles surface-functionalized with an amine group and the maleic anhydride-grafted elastomer may have a weight ratio of 1:0.05 to 5, and more preferably 1:0.1 to 3. By mixing a high content of the ceramic particles, the power generation capacity of the energy harvesting device may be further improved.

In addition, the paste composition according to an exemplary embodiment of the present invention may further include an organic solvent. The organic solvent may allow the ceramic particles surface-functionalized with an amine group and the maleic anhydride-grafted elastomer to be dispersed and mixed uniformly, and may be used without specific limitation as long as it is possible to control a viscosity. As non-limiting specific examples, the organic solvent may be any one or two or more selected from the group consisting of chloroform, chlorobenzene, dichlorobenzene, trichlorobenzene, tetrahydrofuran (THF), formamide, dimethyl formamide (DMF), dimethylacetamide (DMAc), dimethyl sulfoxide (DMSO), toluene, gamma-butyrolactone, acetonitrile, diethylene glycol, 1-methyl-2-pyrrolidone, acetone, acetylacetone, alcohol-based solvents such as α-terpineol, β-terpineol, dihydro terpineol, 2-methoxyethanol, methanol, ethanol, propanol, butanol, pentanol, and hexanol, and the like, ketone and methyl isobutyl ketone, and the like.

A content of the organic solvent may be adjusted so that the paste composition has suitable fluidity for coating or printing. As a specific example, the ceramic particles surface-functionalized with an amine group and the organic solvent may have a weight ratio of 1:1 to 10, but the weight ratio thereof is not necessarily limited thereto.

Hereinafter, a preparation method of a paste composition according to an exemplary embodiment of the present invention is described. Here, respective components may be the same as those described above in the paste composition.

In detail, the preparation method of a paste composition according to an exemplary embodiment of the present invention may include: a) stirring a reaction solution including ceramic particles and a polyamine-based compound to produce ceramic particles surface-functionalized with an amine group; and b) preparing a paste composition including the ceramic particles surface-functionalized with an amine group, and a maleic anhydride-grafted elastomer. More specifically, the paste composition is the energy harvesting paste composition, and a preparation method of an energy harvesting paste composition may include: a) stirring a reaction solution including ceramic particles and a polyamine-based compound to produce ceramic particles surface-functionalized with an amine group; and b) preparing an energy harvesting paste composition including the ceramic particles surface-functionalized with an amine group, and a maleic anhydride-grafted elastomer.

In an example of the present invention, step a) is to functionalize the surface of the ceramic particles with an amine group, wherein the ceramic particles surface-functionalized with an amine group may be produced by mixing the ceramic particles and the polyamine-based compound. As described above, by using the ceramic particles surface-functionalized with an amine group, it is possible to uniformly disperse the ceramic particles in the elastomer.

As a specific example, ceramic particles and a polyamine-based compound may be added to distilled water, respectively, to prepare two dispersions, and the dispersion in which the polyamine-based compound is dispersed may be dropped and stirred in the ceramic particle dispersion to produce the ceramic particles surface-functionalized with an amine group. After the reaction is completed, subsequent processes, such as centrifugation, drying, and the like, may be performed.

Here, the respective dispersions may be controlled to have an acidity of pH of 8 to 14, and more preferably, an acidity of pH of 9 to 11. Thus, by controlling the dispersion to be basic, the surface of the ceramic particles may be coated well with the polyamine-based compound. The acidity is not specifically limited as long as it is a basic compound, and may be controlled. As a non-limiting example, the acidity may be controlled by using, for example, ammonium hydroxide, sodium hydroxide, potassium hydroxide, or the like.

In an example of the present invention, the ceramic particles and the polyamine-based compound may be mixed in a weight ratio of 1:0.1 to 20, and within the range as described above, the surface of the ceramic particles may be effectively functionalized. More preferably, the ceramic particles and the polyamine-based compound are preferably mixed in a weight ratio of 1:0.5 to 10, and more preferably 1:1 to 5. Within the range as described above, the ceramic particles may be functionalized with the amine groups throughout the entire surface thereof, and may have further improved dispersibility when the ceramic particles are mixed with the elastomer.

In an example of the present invention, the polyamine-based compound may be a polyamine-based polymer. By coating the surface of the ceramic particles with the polyamine-based polymer, the ceramic particles may be uniformly and densely functionalized with the amine groups throughout the entire surface thereof, and may have further improved dispersibility when the ceramic particles are mixed with the maleic anhydride-grafted elastomer.

As specific examples, the polyamine-based polymer may be any one or two or more selected from the group consisting of polyalkyleneimine, polyvinylamine, polyamidoamine, polyallylamine, and polyetheramine, and the like. The polyamine-based monomer may be any one or two or more selected from the group consisting of alkylenediamine, dialkylenetriamine, trialkylenetetramine, p-phenylenediamine, m-phenylenediamine, 2,5-diaminotoluene. 2,6-diaminotoluene, 1,3-bis(4,4'-aminophenoxy)benzene, 4,4'-diamino-1,5-phenoxypentane, 4,4'-diaminobiphenyl, 3,3'-dimethyl-4,4'-diaminobiphenyl. 3,3'-dimethoxy-4,4'-diaminobiphenyl, 4,4'-diaminodiphenyl ether, 4,4'-diaminodiphenyl methane, 2,2'-diaminodiphenyl propane, bis(3,5-diethyl-4-aminophenyl)methane, diaminodiphenylsulfone, diaminobenzophenone, diaminonaphthalene, 1,4-bis(4-aminophenoxy)benzene, 1,4-bis(4-aminophenyl)benzene, 9,10-bis(4-aminophenyl)anthracene, 1,3-bis(4-aminophenoxy)benzene, 4,4'-bis(4-aminophenoxy)diphenyl sulfone, 2,2-bis[4-(4-aminophenoxy)phenyl]propane, 2,2'-trifluoromethyl-4,4'-diaminobiphenyl. 1,4-diaminocyclohexane, 1,2-diaminocyclohexane, 1,4-cyclohexane-bis(methylamine), and 4,4'-diaminodicyclohexylmethane, and the like, and as a more specific example, the polyamine-based compound may be preferably polyalkyleneimine such as polyethyleneimine or polypropyleneimine, or the like, containing an alkylene group having 2 to 5 carbon atoms.

Preferably, it may be effective to use the polyamine-based polymer in improving a thickness of the polyamine-based compound coating layer. By improving the thickness of the polyamine-based compound coating layer, it is possible to improve compatibility with the maleic anhydride-grafted elastomer, and thus the content of the ceramic particles in the composition may significantly increase. Therefore, it is possible to manufacture a device in which the ceramic particles having a high content are uniformly dispersed, and the energy generation properties such as the power generation capacity, and the like, are capable of being improved.

More preferably, it may be more effective to use a polyamine-based polymer having a number average molecular weight (Mn) of 10,000 to 80,000 g/mol, particularly preferably a polyamine-based polymer having a number average molecular weight (Mn) of 50,000 to 80,000 g/mol to improve the thickness of the polyamine-based compound coating layer.

Thus, the ceramic particles coated with the polyamine-based compound may have a coating layer having a thickness of 1 to 20 nm. Within the range as described above, the compatibility with the maleic anhydride-grafted elastomer may be remarkably improved.

Here, the ceramic particles are not specifically limited as long as they are ceramic particles for a piezoelectric material that are generally used in the art, and have excellent piezoelectric effect. Specifically, for example, the ceramic particles may be any one or two or more selected from the group consisting of lead zirconate titanate (PZT), lead titanate, barium titanate, zinc oxide, aluminum nitride, cadmium sulfide, bismuth iron oxide, and silicon carbide, and the like. Preferably, the use of PZT may be more desirable in improving the power generation capacity.

In an example, the ceramic particles may have an average particle size of 100 to 1,000 nm. Within the range as described above, the dispersibility of the ceramic particles may be improved. If a size of the ceramic particles is excessively large, the dispersibility may be lowered, resulting in deterioration of energy generation properties.

Next, when the ceramic particles surface-functionalized with an amine group are produced, step b) may be performed. Step b) is to prepare the paste composition, wherein the paste composition may be prepared by mixing the ceramic particles surface-functionalized with an amine group and the maleic anhydride-grafted elastomer. As described above, the paste composition according to the present invention may uniformly disperse the ceramic particles in the polymer by using the ceramic particles surface-functionalized with an amine group. In particular, by using the maleic anhydride-grafted elastomer as the polymer, compatibility between the elastomer and the ceramic particles may increase, and thus the content of the ceramic particles in the composition may significantly increase. Therefore, it is possible to manufacture a device in which the ceramic particles having a high content are uniformly dispersed, and the power generation capacity is capable of being improved.

Here, the ceramic particles surface-functionalized with an amine group and the maleic anhydride-grafted elastomer may have a weight ratio of 1:0.01 to 10, and within the range as described above, a high power generation capacity may be secured. More preferably, the ceramic particles surface-functionalized with an amine group and the maleic anhydride-grafted elastomer may have a weight ratio of 1:0.05 to 5, and more preferably 1:0.1 to 3. By mixing a high content of the ceramic particles, the power generation capacity of the device may be further improved.

In an example of the present invention, it may be preferable to use the maleic anhydride-grafted elastomer having excellent elasticity and being easily deformed by mechanical force such as pressure, tension, vibration, or the like. Specifically, for example, the elastomer may be any one or two or more selected from the group consisting of a polystyrene-based block copolymer-graft-maleic anhydride block copolymer, a polyolefin-based-graft-maleic anhydride elastomer, a polyamide-based-graft-maleic anhydride elastomer, and a polyester-based-graft-maleic anhydride elastomer, and the like.

Preferably, it may be more preferable to use the polystyrene-based block copolymer-graft-maleic anhydride block copolymer in uniformly dispersing ceramic particles surface-functionalized with an amine group and improving a mixed content of the ceramic particles to improve the power generation capacity. As a specific example, the polystyrene-based block copolymer-graft-maleic anhydride block copolymer may be a styrene-ethylene-butylene-styrene-graft-maleic anhydride (SEBSm)-based block copolymer (polystyrene-block-poly(ethylene-ran-butylene)-block-polystyrene-graft-maleic anhydride: SEBSm).

Even more preferably, a styrene-based block copolymer (SBC) may be further used together with the maleic anhydride-grafted elastomer. In other words, the energy harvesting paste composition according to an embodiment of the present invention may further include any one or two or more second elastomers selected from the group consisting of a styrene-butylene-styrene (SBS)-based block copolymer, a styrene-isoprene-styrene (SIS)-based block copolymer, a styrene-ethylene-butylene-styrene (SEBS)-based block copolymer, and a styrene-ethylene-propylene-styrene (SEPS)-based block copolymer, and the like.

As described above, by using a mixture of the second elastomer together with the maleic anhydride-grafted elastomer, energy generation properties may be remarkably improved.

Preferably, when the styrene-ethylene-butylene-styrene-graft-maleic anhydride (SEBSm)-based block copolymer is mixed with the styrene-ethylene-butylene-styrene (SEBS)-based block copolymer, the energy generation properties may be more remarkably improved.

In an example of the present invention, the maleic anhydride-grafted elastomer and the second elastomer may be mixed in a weight ratio of 3:7 to 7:3, and more preferably in a weight ratio of 4:6 to 6:4. Within the range as described above, a high dispersibility and a high content of the ceramic particles may not be inhibited.

In addition, the paste composition according to an exemplary embodiment of the present invention may further include an organic solvent. The organic solvent may allow the ceramic particles surface-functionalized with an amine group and the maleic anhydride-grafted elastomer to be dispersed and mixed uniformly, and may be used without specific limitation as long as it is possible to control a viscosity. As non-limiting specific examples, the organic solvent may be any one or two or more selected from the group consisting of chloroform, chlorobenzene, dichlorobenzene, trichlorobenzene, tetrahydrofuran (THF), formamide, dimethyl formamide (DMF), dimethylacetamide (DMAc), dimethyl sulfoxide (DMSO), toluene, gamma-butyrolactone, acetonitrile, diethylene glycol. 1-methyl-2-pyrrolidone, acetone, acetylacetone, alcohol-based solvents such as α-terpineol, β-terpineol, dihydro terpineol, 2-methoxyethanol, methanol, ethanol, propanol, butanol, pentanol, and hexanol, and the like, ketone and methyl isobutyl ketone, and the like.

A content of the organic solvent may be adjusted so that the paste composition has suitable fluidity for coating or printing. As a specific example, the ceramic particles surface-functionalized with an amine group and the organic solvent may have a weight ratio of 1:1 to 10, but the weight ratio thereof is not necessarily limited thereto.

In addition, the present invention provides a thin film including ceramic particles surface-functionalized with an amine group, and a maleic anhydride-grafted elastomer. More specifically, the present invention provides an energy harvesting thin film including ceramic particles surface-functionalized with an amine group, and a maleic anhydride-grafted elastomer.

The ceramic particles surface-functionalized with an amine group, and the maleic anhydride-grafted elastomer are the same as those described above in the paste composition, and thus repeated descriptions thereof are omitted.

In an example of the present invention, the thin film may be produced from the paste composition. More specifically, in an example of the present invention, the energy harvesting thin film may be produced from the energy harvesting paste composition.

Specifically, the thin film may be produced by applying the paste composition to a preformed mold, followed by heat-treating at 50 to 100° C. for 30 minutes to 5 hours.

Further a device may be manufactured using the same. That is, the device according to an exemplary embodiment may include a thin film including ceramic particles surface-functionalized with an amine group, and a maleic anhydride-grafted elastomer.

More specifically, an energy harvesting device may be manufactured using the same. That is, the energy harvesting device according to an exemplary embodiment may include an energy harvesting thin film including ceramic particles surface-functionalized with an amine group, and a maleic anhydride-grafted elastomer.

Similarly, the ceramic particles surface-functionalized with an amine group, and the maleic anhydride-grafted elastomer are the same as those described above in the paste composition, and thus repeated descriptions thereof are omitted.

Another embodiment of the present invention is to provide an energy harvesting method in which power energy, pressure energy or vibration energy is converted into electrical energy through a device including a thin film produced by applying and drying a paste composition into a mold, the paste composition including ceramic particles surface-functionalized with an amine group, and a maleic anhydride-grafted elastomer.

The above-described energy harvesting method may implement excellent effects due to remarkably excellent power generation capacity.

Similarly, the ceramic particles surface-functionalized with an amine group, and the maleic anhydride-grafted elastomer are the same as those described above in the paste composition, and thus repeated descriptions thereof are omitted.

Hereinafter, a paste composition according to the present invention and a preparation method thereof are described in detail with reference to Examples. It should be understood, however, that the following Examples are only illustrative of the present invention in detail, and the present invention is not limited thereto, and may be implemented in various forms.

In addition, unless defined otherwise, all technical and scientific terms used herein have the same meanings as commonly understood by one of those skilled in the art to which the present disclosure pertains. Terms used herein have purposes of effectively describing particular embodiments only and are not intended to limit the present invention.

In addition, additives that are not specifically described in the specification may have a unit of % by weight.

[Power Generation Voltage]

An output voltage generated from the manufactured device when a predetermined pressure or bending stress was applied to the device was measured. The generated voltage was measured by applying a pressure of 10 to 50 N/m$^2$ to the device at a rate of 1 to 5 cm/s, or bending the device with a bending stress at a rate of 10 to 50 cm/s at a travel distance of 4 to 10 mm. Both ends of the electrodes of the device were connected to a voltage measuring device and an open circuit voltage was measured.

Example 1

4.32 g of lead zirconate titanate (PZT) particles were heat-treated at 900° C. to remove organic materials, and then mixed with 30 g of zirconia balls and 14.4 ml of ethanol, followed by ball milling to produce fine particles.

A dispersion obtained by dispersing 5 g of dried PZT particles in 500 ml of distilled water and a mixture in which 15 g of polyethyleneimine (manufactured by Aldrich with the number average molecular weight (Mn) of about 60,000 by LS, 50 wt % in H$_2$O) was added in 150 ml of distilled water were controlled to have an acidity of 10, respectively, and the polyethyleneimine aqueous solution was added dropwise to the dispersion in which PZT particles were dispersed. Then, the mixture was stirred for 1 hour and centrifuged, and the solvent was dried to produce surface-functionalized PZT particles with an amine group.

Next, the PZT particles surface-functionalized with an amine group, a mixed elastomer in which polystyrene-block-poly(ethylene-ran-butylene)-block-polystyrene-graft-maleic anhydride (SEBSm. Aldrich) and polystyrene-block-poly(ethylene-ran-butylene)-block-polystyrene (SEBS, Aldrich) were mixed at a weight ratio of 1:1, and 1,3-dichlorobenzene were mixed at a weight ratio of 2.3:1:4 to prepare an energy harvesting paste composition.

The prepared energy harvesting paste composition was applied to a preformed mold and dried at 80° C. for 2 hours to produce a thin film. An aluminum-polyimide (PI) electrode was sequentially attached to both sides of the thin film to manufacture an energy harvesting device.

Example 2

Example 2 was performed in the same manner as in Example 1 except that PZT particles surface-functionalized with an amine group, a mixed elastomer in which SEBSm and SEBS were mixed at a weight ratio of 1:1, and 1,3-dichlorobenzene were mixed at a weight ratio of 1:1:4.

Example 3

Example 3 was performed in the same manner as in Example 1 except that PZT particles surface-functionalized with an amine group, a mixed elastomer in which SEBSm and SEBS were mixed at a weight ratio of 7:3, and 1,3-dichlorobenzene were mixed at a weight ratio of 2.3:1:4.

Example 4

Example 4 was performed in the same manner as in Example 3 except that PZT particles surface-functionalized with an amine group, a mixed elastomer in which SEBSm and SEBS were mixed at a weight ratio of 3:7, and 1,3-dichlorobenzene were mixed at a weight ratio of 2.3:1:4.

Example 5

Example 5 was performed in the same manner as in Example 1 except that a poly(ethyleneimine)(manufactured by Aldrich with the number average molecular weight (Mn) of about 1,800 by LS. 50 wt % in H$_2$O) having a number average molecular weight (Mn) of 1,800 g/mol was used.

Example 6

Example 6 was performed in the same manner as in Example 1 except that PZT particles surface-functionalized with an amine group, a single SEBSm elastomer, and 1,3-dichlorobenzene were mixed at a weight ratio of 2.3:1:4.

Comparative Example 1

Comparative Example 1 was performed in the same manner as in Example 1 except that ceramic particles that were not functionalized with an amine group were used.

Comparative Example 2

Comparative Example 2 was performed in the same manner as in Example 1 except that a styrene-butadiene elastomer (poly(styrene-co-butadiene) with styrene 45 wt % manufactured by Aldrich) was used instead of the mixed elastomer of SEBSm and SEBS.

TABLE 1

|  | Power generation voltage (mV) |
|---|---|
| Example 1 | 56000 |
| Example 2 | 3500 |
| Example 3 | 750 |
| Example 4 | 600 |
| Example 5 | 420 |
| Example 6 | 800 |
| Comparative Example 1 | 220 |
| Comparative Example 2 | 200 |

As shown in Table 1, in Examples 1 to 6 in which the energy harvesting devices were manufactured by using the paste compositions prepared by mixing the ceramic particles surface-functionalized with an amine group and the maleic anhydride-grafted elastomer, it could be confirmed that the power generation voltage thereof was as high as 420 mV or more, and thus Examples 1 to 6 had excellent power generation voltage two times or higher than those of Comparative Examples 1 and 2.

Figure 2:
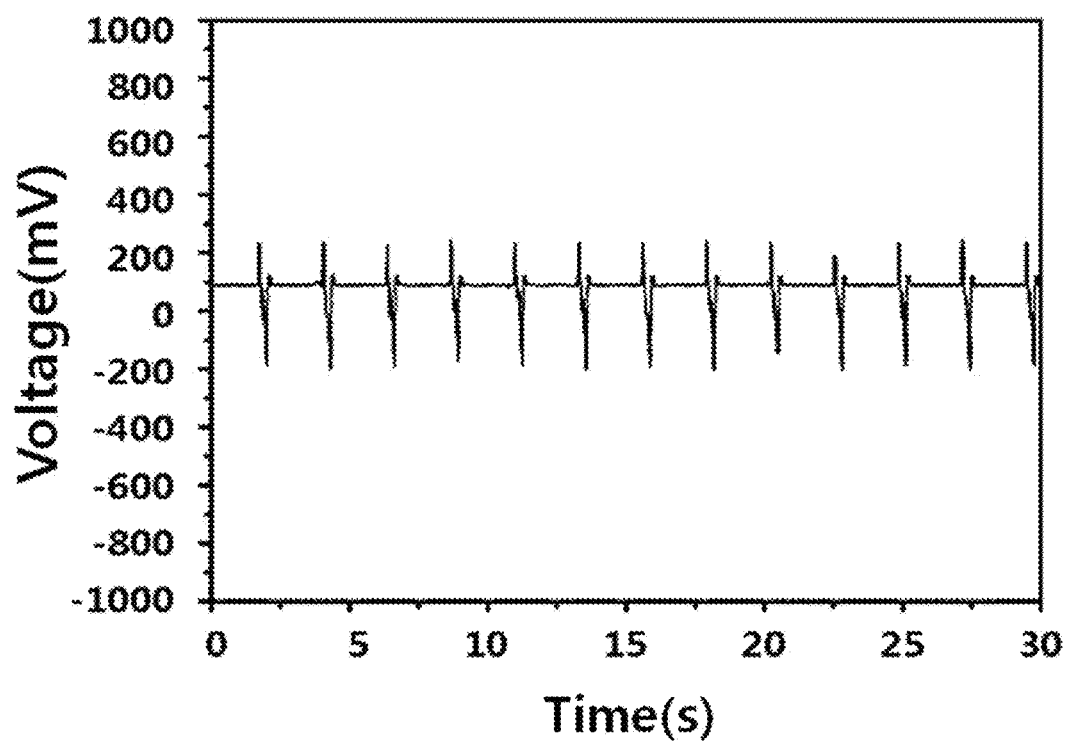
FIG. 2 is a power generation voltage of an energy harvesting device manufactured by using an energy harvesting paste composition of Comparative Example 2.
Figure 3:
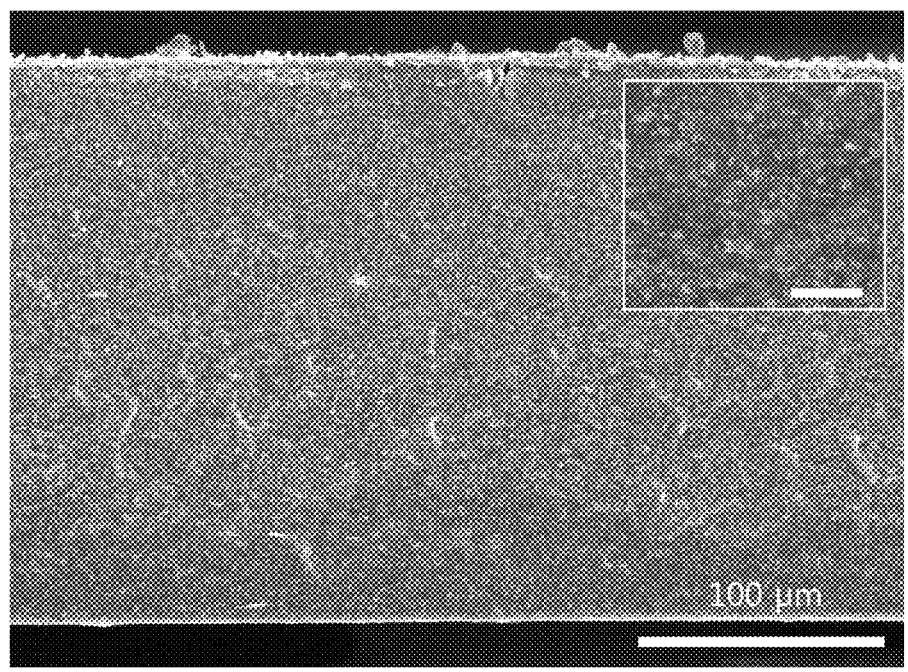
FIG. 3 is a scanning electron microscope (SEM) of an energy harvesting thin film manufactured by using the energy harvesting paste composition of Example 1.

Particularly, in Example 1 in which the mixed elastomer of SEBSm and SEBS was used and the ceramic particles surface-treated with polyethyleneimine satisfying the number average molecular weight of 50,000 to 80,000 were used, it could be confirmed that the power generation voltage was very high as 56 V as shown in FIG. 1, and thus Example 1 had very remarkable power generation voltage 250 times or higher than those of Comparative Examples 1 and 2 as shown in FIG. 2, and it could be confirmed that the ceramic particles were dispersed very uniformly as shown in FIG. 3. This confirmation is considered to have occurred because the coating layer of about 3 to 5 nm was formed by treating the surface of the ceramic particles with polyethyleneimine satisfying a number average molecular weight of 50,000 to 80,000 g/mol, and thus the amine group of the coating layer and the maleic acid group of the maleic anhydride-grafted elastomer were more effectively compatible with each other, thus achieving high dispersion and high content of the ceramic particles.

Figure 4:
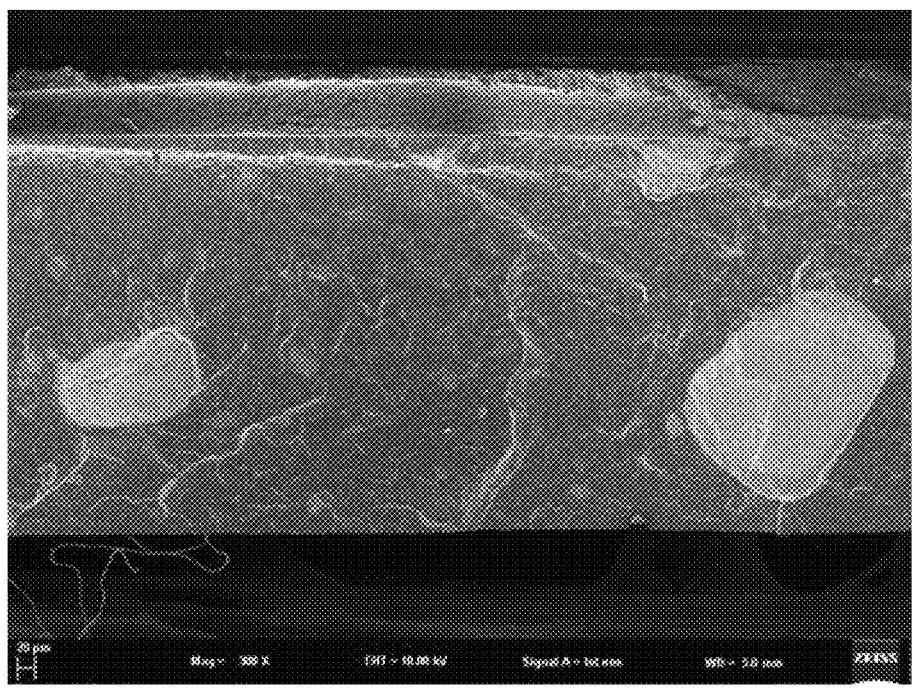
FIG. 4 is a scanning electron microscope (SEM) of an energy harvesting thin film manufactured by using an energy harvesting paste composition of Comparative Example 2.

On the other hand, in Comparative Example 1 in which the mixed elastomer of SEBSm and SEBS was used but the ceramic particles surface-functionalized with an amine group were not used, it could be confirmed that the power generation voltage was as low as 220 mV, and the ceramic particles were dispersed non-uniformly as shown in FIG. 4.

In addition, in Comparative Example 2 in which the ceramic particles surface-functionalized with an amine group were used, but the styrene-butadiene elastomer in which maleic anhydride was not grafted was used as the elastomer, the power generation voltage was as low as 200 mV.

The paste composition according to the present invention may uniformly disperse ceramic particles in a polymer by using ceramic particles surface-functionalized with an amine group. In particular, by using a maleic anhydride-grafted elastomer as the polymer, compatibility between the elastomer and the ceramic particles may increase, and thus the content of the ceramic particles in the composition may significantly increase. Therefore, it is possible to manufacture a device in which the ceramic particles having a high content are uniformly dispersed, and the power generation capacity is capable of being improved.

While preferable exemplary embodiments of the present invention are provided as described above, it is obvious that various changes and modifications, and equivalents thereof may be used, and that the above exemplary embodiments may be suitably modified and equally applied. Therefore, the above descriptions do not limit the scope of the present invention, which is defined by the limitations of the following claims.

What is claimed is:

1. A paste composition comprising:
ceramic particles each surface-functionalized with an amine group, and a maleic anhydride-grafted elastomer, wherein the ceramic particles surface-functionalized with the amine group are formed by dispersing ceramic particles in distilled water and adding polyethyleneimine to form ceramic particles surface-functionalized with the amine group prior to combining the ceramic particles surface-functionalized with the amine group with the maleic anhydride-grafted elastomer;
wherein the ceramic particles and the amine group are in a weight ratio of 1:0.5 to 10.

2. The paste composition of claim 1, wherein the ceramic particles surface-functionalized with the amine group are ceramic particles surface-coated with a polyamine-based compound.

3. The paste composition of claim 2, wherein the polyamine-based compound is a polyamine-based polymer, a polyamine-based monomer, or a mixture thereof, which contains two or more amine groups.

4. The paste composition of claim 3, wherein the polyamine-based polymer is any one or two or more selected from the group consisting of polyalkyleneimine, polyvinylamine, polyamidoamine, polyallylamine, and polyetheramine, and the polyamine-based monomer is any one or two or more selected from the group consisting of alkylenediamine, dialkylenetriamine, trialkylenetetramine, p-phenylenediamine, m-phenylenediamine, 2,5-diaminotoluene, 2,6-diaminotoluene, 1,3-bis(4,4'-aminophenoxy)benzene, 4,4'-diamino-1,5-phenoxypentane, 4,4'-diaminobiphenyl, 3,3'-dimethyl-4,4'-diaminobiphenyl, 3,3'-dimethoxy-4,4'-diaminobiphenyl, 4,4'-diaminodiphenyl ether, 4,4'-diaminodiphenyl methane, 2,2'-diaminodiphenyl propane, bis(3,5-diethyl-4-aminophenyl) methane, diaminodiphenylsulfone, diaminobenzophenone, diaminonaphthalene, 1,4-bis(4-aminophenoxy)benzene, 1,4-bis(4-aminophenyl)benzene, 9,10-bis(4-aminophenyl)anthracene, 1,3-bis(4-aminophenoxy)benzene, 4,4'-bis(4-aminophenoxy)diphenyl sulfone, 2,2-bis[4-(4-aminophenoxy)phenyl]propane, 2,2'-trifluoromethyl-4,4'-diaminobiphenyl, 1,4-diaminocyclohexane, 1,2-diaminocyclohexane, 1,4-cyclohexane-bis(methylamine), and 4,4'-diaminodicyclohexylmethane.

5. The paste composition of claim 1, wherein the ceramic particles are any one or two or more selected from the group consisting of lead zirconate titanate (PZT), barium titanate, zinc oxide, potassium nitride, aluminum nitride, bismuth iron oxide, and silicon carbide.

6. The paste composition of claim 1, wherein the maleic anhydride-grafted elastomer is any one or two or more selected from the group consisting of a polystyrene-based block copolymer-graft-maleic anhydride block copolymer, a polyolefin-based-graft-maleic anhydride elastomer, a polyamide-based-graft-maleic anhydride elastomer, and a polyester-based-graft-maleic anhydride elastomer.

7. The paste composition of claim 1, further comprising:
any one or two or more second elastomers selected from the group consisting of a styrene-butylene-styrene (SBS)-based block copolymer, a styrene-isoprene-styrene (SIS)-based block copolymer, a styrene-ethylene-butylene-styrene (SEBS)-based block copolymer, and a styrene-ethylene-propylene-styrene (SEPS)-based block copolymer.

8. The paste composition of claim 1, wherein the paste composition is an energy harvesting paste composition.

9. A thin film comprising:
ceramic particles each surface-functionalized with an amine group, and a maleic anhydride-grafted elastomer, wherein the ceramic particles surface-functionalized with the amine group and the maleic anhydride-grafted elastomer have a weight ratio of 1:0.01 to 3.

10. A device comprising:
a thin film including negatively charged ceramic particles each surface-functionalized with a positively charged amine group, and a maleic anhydride-grafted elastomer, wherein the ceramic particles are highly dispersed within the maleic anhydride-grafted elastomer;
wherein the ceramic particles and the amine group are in a weight ratio of 1:0.5 to 10.

11. An energy harvesting method in which power energy, pressure energy, or vibration energy is converted into electrical energy through a device including a thin film produced by applying and drying the paste composition of claim 1 into a mold.

12. The energy harvesting method of claim 11, wherein the ceramic particles surface-functionalized with the amine group are ceramic particles surface-coated with a polyamine-based compound.

13. The energy harvesting method of claim 12, wherein the polyamine-based compound is a polyamine-based polymer, a polyamine-based monomer, or a mixture thereof, which contains two or more amine groups.

14. The energy harvesting method of claim 13, wherein the polyamine-based polymer is any one or two or more selected from the group consisting of polyalkyleneimine, polyvinylamine, polyamidoamine, polyallylamine, and polyetheramine, and the polyamine-based monomer is any one or two or more selected from the group consisting of alkylenediamine, dialkylenetriamine, trialkylenetetramine, p-phenylenediamine, m-phenylenediamine, 2,5-diaminotoluene, 2,6-diaminotoluene, 1,3-bis(4,4'-aminophenoxy)benzene, 4,4'-diamino-1,5-phenoxypentane, 4,4'-diaminobiphenyl, 3,3'-dimethyl-4,4'-diaminobiphenyl, 3,3'-dimethoxy-4,4'-diaminobiphenyl, 4,4'-diaminodiphenyl ether, 4,4'-diaminodiphenyl methane, 2,2'-diaminodiphenyl propane, bis(3,5-diethyl-4-aminophenyl)methane, diaminodiphenylsulfone, diaminobenzophenone, diaminonaphthalene, 1,4-bis(4-aminophenoxy)benzene, 1,4-bis(4-aminophenyl)benzene, 9,10-bis(4-aminophenyl)anthracene, 1,3-bis(4-aminophenoxy)benzene, 4,4'-bis(4-aminophenoxy)diphenylsulfone, 2,2-bis[4-(4-aminophenoxy)phenyl]propane, 2,2'-trifluoromethyl-4,4'-diaminobiphenyl, 1,4-diaminocyclohexane, 1,2-diaminocyclohexane, 1,4-cyclohexane-bis(methylamine), and 4,4'-diaminodicyclohexylmethane.

15. The energy harvesting method of claim 11, wherein the ceramic particles are any one or two or more selected from the group consisting of lead zirconate titanate (PZT), barium titanate, zinc oxide, potassium nitride, aluminum nitride, bismuth iron oxide, and silicon carbide.

16. The energy harvesting method of claim 11, wherein the maleic anhydride-grafted elastomer is any one or two or more selected from the group consisting of a polystyrene-based block copolymer-graft-maleic anhydride block copolymer, a polyolefin-based-graft-maleic anhydride elastomer, a polyamide-based-graft-maleic anhydride elastomer, and a polyester-based-graft-maleic anhydride elastomer.

17. The energy harvesting method of claim 11, wherein the paste composition further includes any one or two or more second elastomers selected from the group consisting of a styrene-butylene-styrene (SBS)-based block copolymer, a styrene-isoprene-styrene (SIS)-based block copolymer, a styrene-ethylene-butylene-styrene (SEBS)-based block copolymer, and a styrene-ethylene-propylene-styrene (SEPS)-based block copolymer.

18. The thin film of the device of claim 10, wherein the ceramic particles surface-functionalized with the amine group and the maleic anhydride-grafted elastomer have a weight ratio of 1:0.01 to 3.

* * * * *